United States Patent [19]
Embree

[11] Patent Number: 6,104,222
[45] Date of Patent: Aug. 15, 2000

[54] FLEXIBLE PHASE LOCKED LOOP SYSTEM

[75] Inventor: Paul Michael Embree, Irvine, Calif.

[73] Assignees: Sony Corporation, Tokyo, Japan; Sony Electronics, Inc., Park Ridge, N.J.

[21] Appl. No.: 08/992,641

[22] Filed: Dec. 17, 1997

[51] Int. Cl.[7] ....................................................... H03L 7/06
[52] U.S. Cl. ........................... 327/156; 327/154; 327/162
[58] Field of Search ..................................... 327/147, 156, 327/155, 154, 162, 163; 331/1 A, 8, 17, 25, DIG. 2

[56] References Cited

U.S. PATENT DOCUMENTS

| | | | |
|---|---|---|---|
| 5,144,254 | 9/1992 | Wilke | 327/107 |
| 5,742,208 | 4/1998 | Blazo | 331/23 |
| 5,889,436 | 3/1999 | Yeung et al. | 331/2 |

Primary Examiner—Kenneth B. Wells
Assistant Examiner—Hai L. Nguyen
Attorney, Agent, or Firm—Blakely, Sokoloff, Taylor & Zafman LLP

[57] ABSTRACT

A stable and flexible phase locked loop system and method are disclosed. The system comprises a first phase frequency detector for detecting a difference between an internal clock signal and an external clock signal, and for generating a first control signal representing the difference. A first voltage controlled oscillator coupled to the first phase detector generates a first timing signal based on the first control signal. A first divider circuit coupled to the first voltage controlled oscillator divides the first timing signal by a first predetermined number to provide an output signal. A second phase frequency detector detects a difference between the first timing signal and a second timing signal, to generate a second control signal representing the difference. A second voltage controlled oscillator coupled to said second phase detector generates a third timing signal based on the second control signal. A second divider circuit coupled to the second voltage controlled oscillator divides the third timing signal by a second predetermined number to provide the second timing signal. A third divider circuit coupled to the second voltage controlled oscillator divides the third timing signal by a third predetermined number to provide the internal clock signal.

32 Claims, 6 Drawing Sheets

FIG. 3

| PERCENTAGE DERIVED | 1 | 2 | 3 | 4 | 5 | 6 |
|---|---|---|---|---|---|---|
| Speed | Down Speed | 44.1KHz | Up Speed | Down Speed | 48.0KHz | Up Speed |
| Reference | 44100.00 | | 44100.00 | 48000.00 | | 48000.00 |
| Sample Freq (f₁) (Actual) | 44055.94 | 44100.00 | 44144.10 | 47952.05 | 48000.00 | 48048.00 |
| XTAL Frequency (fv) | 11278322 | 11289600 | 11300890 | 12275724 | 12288000 | 12300288 |

| VIDEO DERIVED | 1 | 2 | 3 | 4 | 5 | 6 |
|---|---|---|---|---|---|---|
| Target Freq. | 44100 | | 44100 | 48000 | | 48000 |
| Div. 30 | 1470 | | 1470 | 1600 | | 1600 |
| Frame Rate (f₁) | 29.9700 | | 30.0300 | 29.9700 | | 30.0300 |
| x Frame | 44055.94406 | | 44144.10000 | 47952.04795 | | 48048.00000 |
| XTAL Freq. (fv) | 11278321.68 | | 11300889.6 | 12275724.28 | | 12300288 |

| DIFFERENCES | | | | | | |
|---|---|---|---|---|---|---|
| Difference (Hz) | 0.00000 | | 0.00000 | 0.00000 | | 0.00000 |
| Difference (ppm) | 0.00 | | 0.00 | 0.00 | | 0.00 |

| REFERENCE DATA (VIDEO TIMING) | |
|---|---|
| Color Burst | 3579545.455 |
| H Rate | 15734.26573 |
| Frame Rate (f₁) | 29.97002997 |
| % Speed (Calculated) | 0.999000999 |
| Frame Rate | 59.94005994 |

| | |
|---|---|
| | 30.03000 |
| | 1.00100000 |
| | 60.06000 |

FIG. 4A

| | | NTSC Color | NTSC BW | PAL |
|---|---|---|---|---|
| Sample Rate (f₁) | 48000 | | | |
| VCO Freq. (fv) | 12288000 | | | |
| H Rate | | 15734.26573 | 15750 | 15625 |
| P Divider | | 15 | 10 | 10 |
| P Output Freq | | 1048.951049 | 1575 | 1562.5 |
| D Divider | | 32 | 32 | 32 |
| D Output Freq. | | 384,000.00 | 384,000.00 | 384,000.00 |
| N Divider | | 50 | 42 | 50 |
| VCO Freq. | | 19,200,000.00 | 16,128,000.00 | 19,200,000.00 |
| M Divider | | 18304 | 10240 | 12288 |
| M Output Freq. | | 1048.951049 | 1575 | 1562.5 |
| PFD Error | | 0 | 0 | 0 |

130 points to top section, 155 points to M Divider row.

FIG. 4B

| | | NTSC Color | NTSC BW | PAL |
|---|---|---|---|---|
| Sample Rate (f₁) | 44100 | | | |
| VCO Freq. (fv) | 11289600 | | | |
| H Rate | | 15734.26573 | 15750 | 15625 |
| P Divider | | 10 | 10 | 10 |
| P Output Freq | | 1573.426573 | 1575 | 1562.5 |
| D Divider | | 64 | 32 | 64 |
| D Output Freq. | | 176,400.00 | 352,800.00 | 176,400.00 |
| N Divider | | 125 | 42 | 125 |
| VCO Freq. | | 22,050,000.00 | 14,817,600.00 | 22,050,000.00 |
| M Divider | | 14014 | 9408 | 14112 |
| M Output Freq. | | 1573.426573 | 1575 | 1562.5 |
| PFD Error | | 0 | 0 | 0 |

| | On Speed | Up Speed | Down Speed | On Speed | Up Speed | Down Speed |
|---|---|---|---|---|---|---|
| Sample Rate (f₁) | 48000 | 48048.00 | 47952.05 | 44100 | 44144.10 | 44055.94 |
| VCO Freq. (fv) | 12288000 | 12300288 | 12275724 | 11289600 | 11300890 | 11278322 |
| | NTSC Color | NTSC Color | NTSC Color | NTSC Color | NTSC Color | NTSC Color |
| H Rate | 15734.26573 | 15734.26573 | 15734.26573 | 15734.26573 | 15734.26573 | 15734.26573 |
| P Divider | 15 | 15 | 10 | 10 | 10 | 10 |
| P Output Freq | 1048.951049 | 1048.951049 | 1573.426573 | 1573.426573 | 1573.426573 | 1573.426573 |
| D Divider | 32 | 32 | 32 | 64 | 32 | 32 |
| D Output Freq. | 384,000.00 | 384,384.00 | 383,616.38 | 176,400.00 | 353,152.80 | 352,447.55 |
| N Divider | 50 | 49 | 42 | 125 | 49 | 42 |
| VCO Freq. | 19,200,000.00 | 18,834,816.00 | 16,111,888.11 | 22,050,000.00 | 17,304,487.20 | 14,802,797.20 |
| M Divider | 18304 | 17956 | 10240 | 14014 | 10998 | 9408 |
| M Output Freq. | 1048.951049 | 1048.942749 | 1573.426573 | 1573.426573 | 1573.421277 | 1573.426573 |
| PFD Error | 0 | 0.008300009 | -2.27374E-13 | 0 | 0.0052296831 | -2.27374E-13 |
| PPM Error | | 7.912675429 | | | 3.36643026 | |
| | | 17955.85792 | | | 10997.96298 | |

FIG. 5

FLEXIBLE PHASE LOCKED LOOP SYSTEM

BACKGROUND OF THE INVENTION

1. Field of the Invention

The present invention relates in general to phase locked loop circuits and more particularly, to a method and apparatus for providing a flexible phase locked loop system that is compatible with a variety of standards.

2. Description of the Related Art

In the filming industry, it is desirable to synchronize each film frame or video frame to the corresponding audio samples, so that the appropriate speech, music and/or sound effects may be matched with the corresponding action during playback.

To accomplish this, the frames are counted and provided to a master circuit which runs the projector and the audio systems at the same speed. As shown in FIG. 1A, the film is typically run at 24 frames per second. The audio signals are typically sampled at 48 kHz. For this example, each of the frames have 2,000 corresponding audio samples. The master circuit typically employs a phase locked loop (PLL) system 10 (FIG. 1B) comprising a phase-frequency detector (PFD) 12, a voltage-controlled oscillator (VCO) 14, a divide-by-A circuit 16 and a divide-by-B circuit 18. The frequency divider circuits 16 and 18 are used in the feedback loops of the PLL so that frequencies higher than that of the input clock signal can be generated. The output of the VCO 14 is provided as a first output signal for internal operations of the master circuit. The output of the VCO 14 is also provided to the divide-by-A circuit 16, which subsequently generates a second output signal that is typically used to synchronize the video information with audio information (which typically operates at 48 kHz). The value of A is determined by the ratio of the master clock frequency to the audio frequency to be synchronized to. For example, if the audio frequency is 48 kHz, and the master clock frequency is 12.288 MHz, A=256.

The second output signal is also provided to the divide-by-B circuit 18. The divide-by-B circuit 18 generates a feedback signal that is provided to the PFD 12. The value of B is determined by a ratio of the audio frequency to be synchronized to and the frame clock frequency. For example, if the audio frequency is 48 kHz and the frame clock frequency is 24 Hz, the value of B will be 2,000. The PFD 12 receives input signals from a frame clock and compares the phase/frequency of the input signals with the phase/frequency of the feedback signal. The PFD 12 produces a control voltage which is a function of the difference (error) between the input signal and the feedback signal. The PFD 12 presents the control voltage to a loop filter 14, which filters the output voltage of the PFD 12 and subsequently provides the filtered output voltage to the VCO 16 to adjust the frequency of the output signal. After some time as determined by the frequency response of the loop, the PLL system 10 locks onto the input clock signal and presents an output having a stable frequency and phase.

However, such an approach requires a substantially lengthy period for the PLL system 10 to lock onto the input clock signal, because the input clock signal operates at a low frequency, typically 24 Hz. In addition, the PLL system 10 is susceptible to noise conditions such as power supply fluctuations, etc. To avoid the slow response time and instability of such a PLL system, a higher input clock frequency is used. A typical frequency is the horizontal frequency as established by the National Television Systems Committee (NTSC). Although such an approach overcomes the slow response time and instability problems of the previous technique, it cannot provide the flexibility of accommodating a variety of video formats like the Phase Alternating Line (PAL), Sequential Couleur avec Memoire (SECAM) and NTSC.

Accordingly, there is a need in the technology for providing a stable PLL system that provides a fast response time, while providing flexibility and compatibility with a variety of video standards.

BRIEF SUMMARY OF THE INVENTION

A stable and flexible phase locked loop system and method are disclosed. The system comprises a first phase frequency detector for detecting a difference between an internal clock signal and an external clock signal, and for generating a first control signal representing the difference. A first voltage controlled oscillator coupled to the first phase detector generates a first timing signal based on the first control signal. A first divider circuit coupled to the first voltage controlled oscillator divides the first timing signal by a first predetermined number to provide an output signal. A second phase frequency detector detects a difference between the first timing signal and a second timing signal, to generate a second control signal representing the difference. A second voltage controlled oscillator coupled to said second phase detector generates a third timing signal based on the second control signal. A second divider circuit coupled to the second voltage controlled oscillator divides the third timing signal by a second predetermined number to provide the second timing signal. A third divider circuit coupled to the second voltage controlled oscillator divides the third timing signal by a third predetermined number to provide the internal clock signal.

BRIEF DESCRIPTION OF THE DRAWINGS

FIG. 3 is a chart illustrating a variety of frequency values that VCO 130 of FIG. 2 may be configured to provide, so as to enable the PLL system 100 to accommodate a corresponding variety of input signals.

FIGS. 4A and 4B are charts illustrating a variety of values P, D, N and M for the respective divide counters 110, 140, 156 and 160 of FIG. 2, corresponding to a variety of video formats.

FIG. 5 is a chart illustrating a variety of values of the divide counters P, D, N and M for the respective divide counters 110, 140, 156 and 160 of FIG. 2, when the phase lock loop system 100 is configured to adjust the corresponding frequencies provided by a variety of systems.

DETAILED DESCRIPTION OF THE INVENTION

The present invention is an apparatus and method for providing a stable phase locked loop system that provides a fast response time, while providing compatibility with a variety of video standards.

Figure 1A:
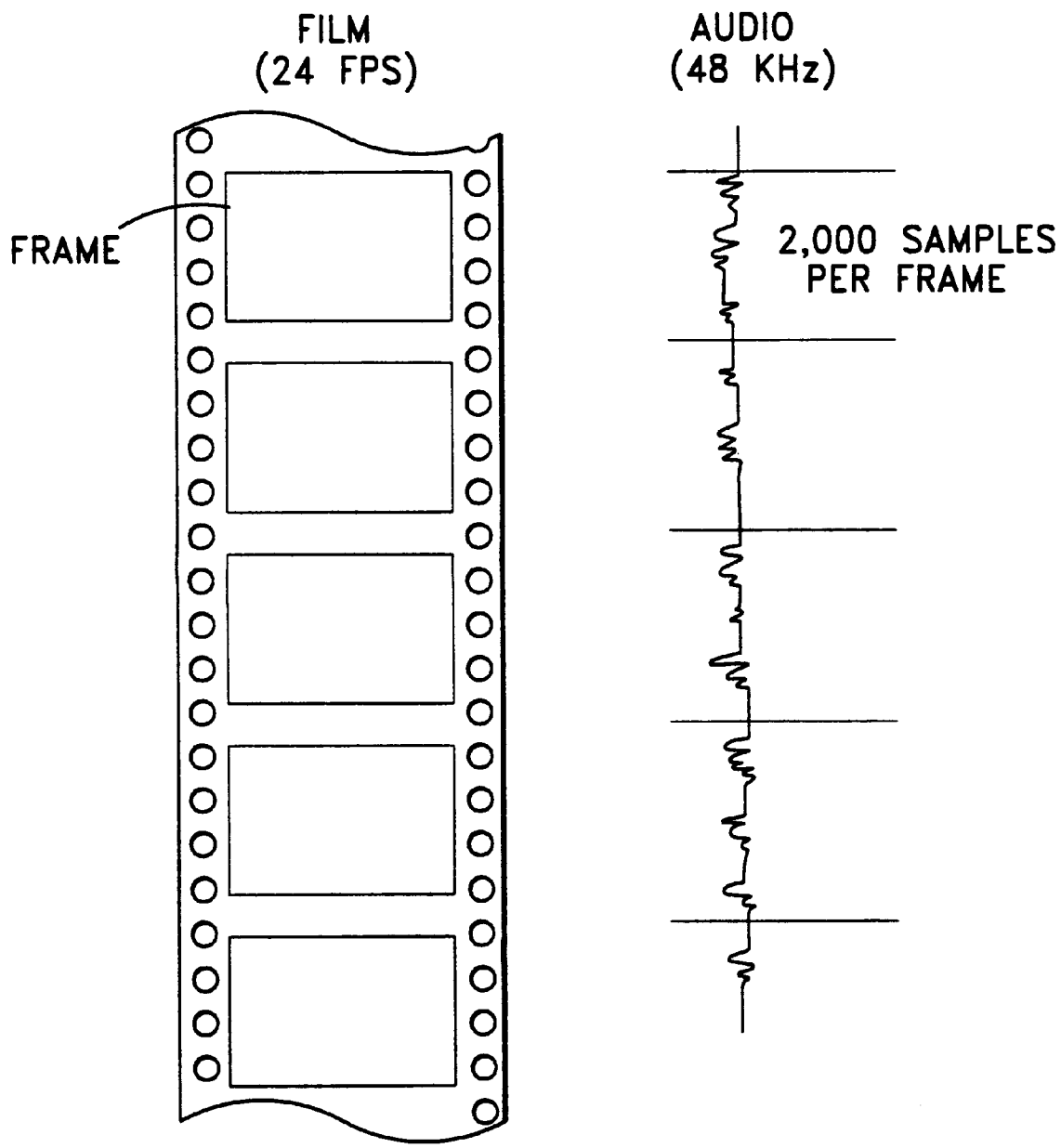
FIG. 1A illustrates a conventional technique for synchronizing video and audio information.
Figure 1B:
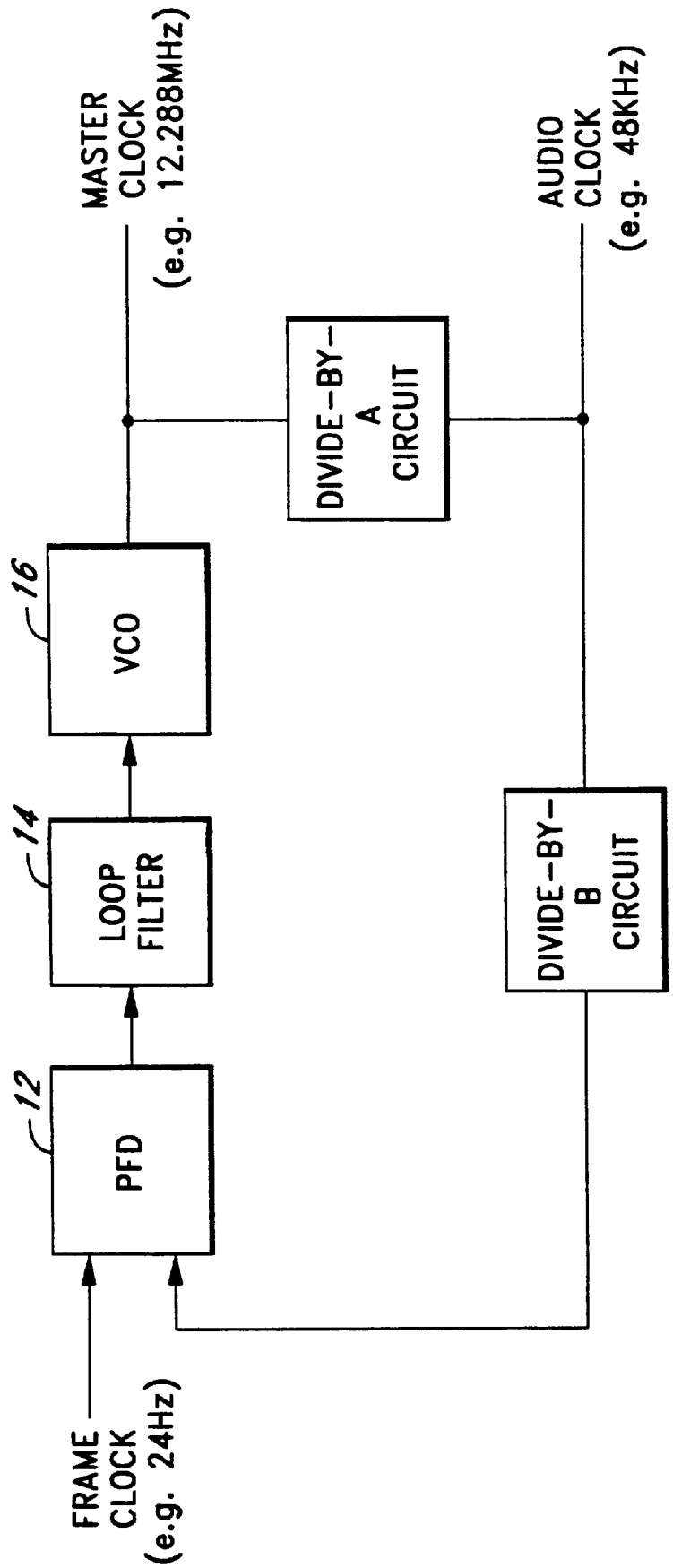
FIG. 1B illustrates a conventional phase locked loop circuit.
Figure 2:
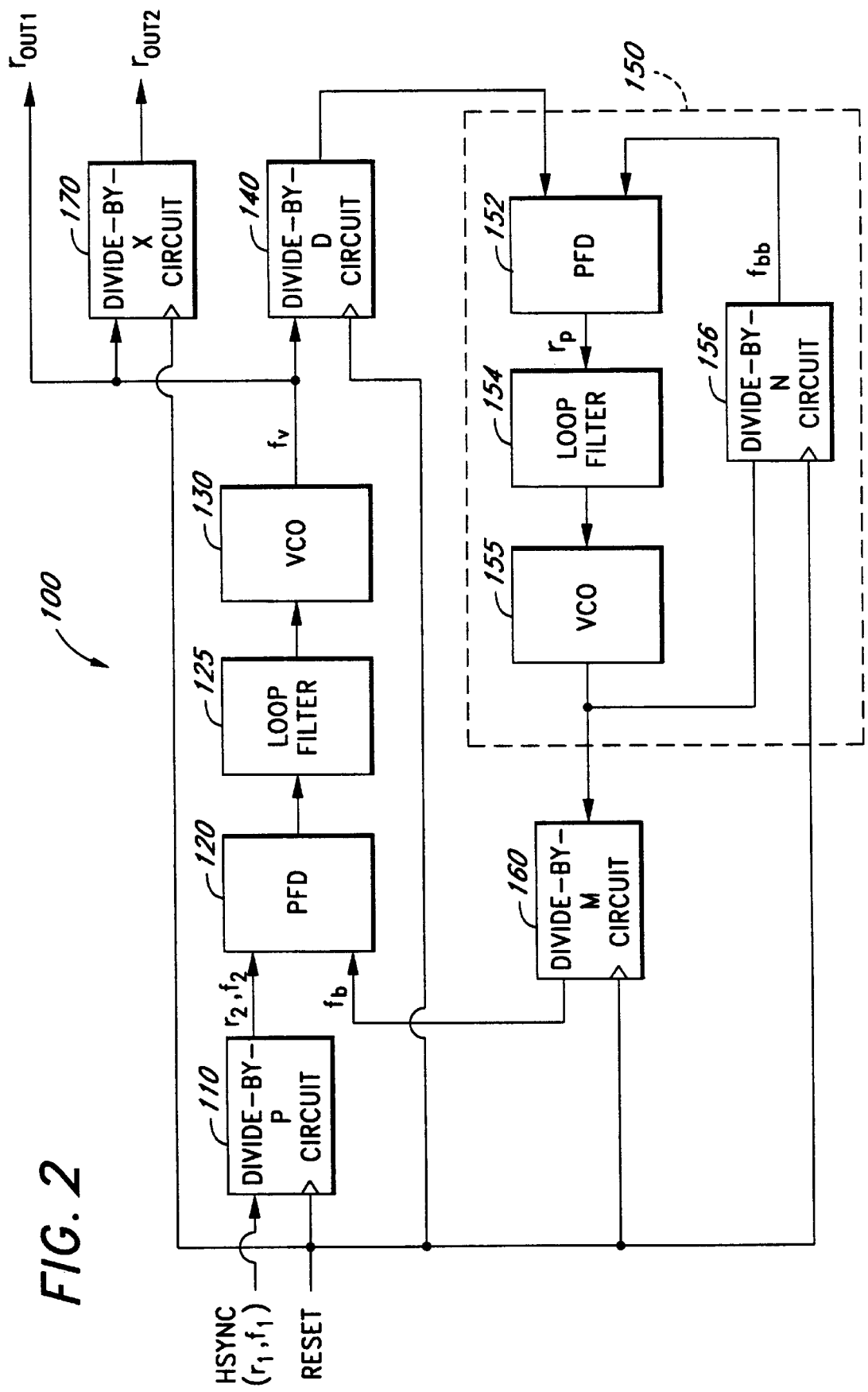
FIG. 2 illustrates one embodiment of the phase locked loop system 100 in accordance with the teachings of the present invention.

FIG. 2 illustrates one embodiment of the phase locked loop system 100 in accordance with the teachings of the present invention. In the following discussion, the phase locked loop (PLL) system 100 is described with reference to a horizontal synchronization (HSYNC) signal that is derived from a video signal. Although the PLL system 100 of the present invention may be particularly suited for synchronizing video information to audio information, it is apparent to one of ordinary skill in the technology that the PLL system 100 may be readily applied to any other system in which frequency or phase synchronization is required.

The phase locked loop (PLL) system 100 comprises a divide-by-P circuit 110, a phase frequency detector (PFD) 120, a loop filter 125, a voltage-controlled oscillator (VCO) 130, a divide-by-D circuit 140, a phase lock loop circuit 150 and a divide by M circuit 160. In one embodiment, the voltage-controlled oscillator 130 is a voltage-controlled crystal oscillator. In one embodiment, the PFD 120 and VCO 130 may be implemented using the High Performance Phase Locked Loop as marketed by Texas Instruments of Dallas, Tex., under the part designation TLC29321. In one embodiment, the loop filter 125 may be implemented using a low pass filter. Examples of such a low pass filter includes a lag filter, a lag-lead filter and an active filter. The PLL system 100 receives the HSYNC signal r1, and provides the HSYNC signal to a divide-by-P circuit 110 which divides the frequency f1 of r1 by an integer, P. This is accomplished so as to enable the user to configure the PLL system 100 to operate at any desired lower frequency. The resulting signal r2 has a frequency f2=f1/P, which is provided as one input to phase frequency detector (PFD) 120.

The PFD 120 compares the input signal r2 with a feedback signal fb and provides a control voltage to a loop filter 125. The loop filter 125 is provided to ensure stable loop operation and low jitter. The filtered control voltage is then provided to the VCO 130 which generates a frequency fv. The output of the VCO 130 is provided as a first output clock signal $r_{OUT1}$, which is used to drive the internal operations of the master circuit (not shown) which implements the PLL system 100. It is apparent to one of ordinary skill in the technology that the first output clock signal $r_{OUT1}$ may be used to drive any desired circuit. The output of the VCO 130 is also provided to a divide-by-X circuit 170, which subsequently generates a second output clock signal $r_{OUT2}$ that is used to drive a second circuit (not shown). For example, $r_{OUT2}$ may be used as a master clock to analog-to-digital (A/D) or digital-to-analog (D/A) converters operating at the audio sample rate. It is apparent to one of ordinary skill in the technology that the PLL system 100 may be used to synchronize r1 with $r_{OUT1}$ and/or $r_{OUT2}$. In one embodiment, the value of X is determined by a ratio of the master clock frequency for the audio converters to the audio sample frequency. For example, if the audio information operates at 48 kHz and the master clock frequency (i.e., $r_{OUT1}$) is 12.8 MHz etc., then the value of X is 256.

The first output signal $r_{OUT1}$ is also provided to the divide-by-D circuit 140, which divides the frequency of $r_{OUT1}$ by an integer D. The divide-by-D circuit 140 is implemented to facilitate use of a phase locked loop (PLL) circuit 150 that operates at a desired frequency. The resulting signal, r3 (which has a frequency of f3) is provided to the PLL circuit 150, which in turn generates a signal r4 having a frequency of f4. The value of D is determined by a ratio of the frequency of $r_{OUT1}$, i.e., $f_{OUT1}$, to the quantity (M*f1/N). The PLL circuit 150 is used to assist in locking the signal r4 to the frequency of the signal r3, i.e., to f3. In one embodiment, the PLL circuit 150 comprises a PFD 152, a loop filter 154, a VCO 155 and a divide-by-N circuit 156. In one embodiment, the PFD 152 and VCO 155 may be implemented using the High Performance Phase Locked Loop as marketed by Texas Instruments of Dallas, Tex., under the part designation TLC29321. In one embodiment, the loop filter 154 may be implemented using a low pass filter. Examples of such a low pass filter includes a lag filter, a lag-lead filter and an active filter.

The PFD 152 receives r3 and compares the phase/frequency of r3 (i.e., f3) with the phase/frequency of a feedback signal fbb. The PFD 152 produces a control voltage which is a function of the difference (error) between the input signal r3 and the feedback signal. This difference is a frequency difference between the input signal r3 and the feedback signal fbb, when the PLL circuit 150 has not yet locked onto the input signal r3. Upon locking onto the input signal r3, the PFD 152 detects the phase difference between the input signal r3 and the feedback signal fbb. The PFD 152 presents the control voltage to loop filter 154, which filters the control voltage and subsequently provides the filtered control voltage to the VCO 155 to adjust the frequency of its output signal rp. The output of VCO 155 is provided as a feedback signal to the divide-by-N circuit 156, which divides the frequency of the output of VCO 155 by N. The resulting signal is provided as a feedback signal fbb to PFD 152. After some response time, as determined by the frequency response of the loop filter 154, the PLL circuit 150 locks onto the signal r3 and presents an output signal r4.

The signal r4 is next provided to a divide-by-M circuit 160, which subsequently divides the f4 by an integer M. The value of M is determined by f4/f1. The divide-by-M circuit 160 generates a feedback signal fb that is provided to the PFD 120. As discussed earlier, the PFD 120 receives HSYNC signals from a frame clock and compares the phase/frequency of the input signals with the phase/frequency of the feedback signal fb. The PFD 120 produces a control voltage which is a function of the difference (error) between the input signal (i.e., HSYNC or r1) and the feedback signal fb. This difference is a frequency difference between the input signal (HSYNC or r1) and the feedback signal fb, when the PLL circuit 100 has not yet locked onto the input signal (HSYNC or r1). Upon locking onto the input signal (HSYNC or r1), the PFD 120 detects the phase difference between the input signal (HSYNC or r1) and the feedback signal fb. The PFD 120 presents a control voltage to the VCO 130 to adjust the frequency of the output signal. After some time as determined by the frequency response of the loop filter 125, the PLL system 100 locks onto the input clock signal r1 and presents output signals $r_{OUT1}$ and $r_{OUT2}$, each having a stable frequency and phase.

The relationship between the values P, D, N and M of the respective divider circuits 110, 140, 156 and 160, with that of the input signal, HSYNC (or r1 having a frequency of f1) and the frequency fv generated by the VCO 130 may be expressed as follows:

$$f1/P=[fv*N]/[D*M]$$

Using numerical techniques, the smallest value of P, N, D and M may be obtained. It is apparent to one of ordinary skill in the technology that divider circuit(s) providing any other multiple of the smallest value of P, N, D and M may be implemented, according to need and availability.

A further aspect of the present invention is the use of a reset signal RESET (see FIG. 2) for synchronizing the reset of all the divider circuits 110, 140, 156, 160 and 170. As is apparent to one of ordinary skill in the art, any combination of the divider circuits 110, 140, 156, 160 and 170 may be synchronously or simultaneously reset using the reset signal. In this manner, all or a combination of the divider circuits 110, 140, 156, 160 and 170 may be reset with a single input, and timing considerations associated with individual reset of the divider circuits 110, 140, 156, 160 and 170 may be dispensed with. In one embodiment, the reset signal is applied coincident with the frame edge of the incoming video source so that the audio sample clock edge is exactly coincident with the video frame edge.

FIG. 3 is a chart illustrating a variety of frequency values that the crystal oscillator of FIG. 2 may be configured to provide, so as to accommodate a corresponding variety of frame rates. As shown, for a sample rate of 48 kHz, the VCO 130 provides a frequency of 44.1 kHz.

FIGS. 4A and 4B are charts illustrating a variety of values P, D, N and M for the respective divide counters 110, 140, 156 and 160 of FIG. 2, corresponding to a variety of video formats, based on a sample rate of 48 kHz (i.e., where $r_{OUT2}$ is 48 kHz) and where fv, the frequency generated by the VCO 130 is 12.288 MHz. As shown in FIG. 4A, when interfacing with an NTSC Color format, the input signal r1 has a frequency f1 of 15.73426573 kHz. The corresponding value of P for divide-by-P circuit 110 is 15, so as to provide a signal r2 of frequency 1.048951049 kHz. The corresponding value of D in the divide-by-D circuit 140 is 32, and the output frequency f3 of the divide-by-D circuit 140 is 384.000 kHz. The corresponding value of N in the divide-by-N circuit 156 is 50, while the frequency of the VCO 155 is 19.2 MHz. The corresponding value of M in the divide-by-M circuit 160 is 18304, while the output frequency of the divide-by-M circuit 160 is 1.048951049 kHz.

When interfacing with an NTSC Black and White format, the input signal r1 has a frequency f1 of 15.750 kHz. The corresponding value of P for divide-by-P circuit 110 is 10, so as to provide a signal r2 of frequency 1.575 kHz. The corresponding value of D in the divide-by-D circuit 140 is 32, and the output frequency f3 of the divide-by-D circuit 140 is 384.000 kHz. The corresponding value of N in the divide-by-N circuit 156 is 42, while the frequency of the VCO 155 is 16.128 MHz. The corresponding value of M in the divide-by-M circuit 160 is 10240, while the output frequency of the divide-by-M circuit 160 is 1.575 kHz.

When interfacing with the PAL format, the input signal r1 has a frequency f1 of 15.625 kHz. The corresponding value of P for divide-by-P circuit 110 is 10, so as to provide a signal r2 of frequency 1.5625 kHz. The corresponding value of D in the divide-by-D circuit 140 is 32, and the output frequency f3 of the divide-by-D circuit 140 is 384.000 kHz. The corresponding value of N in the divide-by-N circuit 156 is 50, while the frequency of the VCO 155 is 19.2 MHz. The corresponding value of M in the divide-by-M circuit 160 is 12288, while the output frequency of the divide-by-M circuit 160 is 1.5625 kHz.

The phase lock loop system 100 of the present invention may also be implemented for adjusting the frequencies of a variety of systems. For example, video and/or audio information may be recorded at a first frequency ff1. The equipment utilized for playing back the recorded information may be configured to operated at a second frequency ff2, that is "off" or different from the first frequency by a small, albeit significant, frequency. Accordingly, the phase locked loop system 100 may be used to provide synchronization of the recorded information with the operational frequency of the playback equipment.

FIG. 5 is a chart illustrating a variety of values P, D, N and M for the respective divide counters 110, 140, 156 and 160 of FIG. 2, when the phase lock loop system 100 is configured to adjust the corresponding frequencies provided by a variety of systems. As shown, the "off" speeds differ from the sample rate of 48 kHz or 44.1 kHz by ±0.1%. In the case of the sample rate of 48 kHz, the "off" speeds include an "up" speed of 48.048 kHz (difference of +0.1% from 48 kHz), and a "down" speed of 47.95205 kHz (difference of −0.1% from 48 kHz). In such a case, the various values, such as P, D, N, fv and M must be reconfigured.

For example, when interfacing with the NTSC format, and used for adjusting from a sample rate of 48 kHz to an "up" speed of 48.048 kHz, the input signal r1 has a frequency f1 of 15.73426573 kHz. The corresponding value of P for divide-by-P circuit 110 is 15, so as to provide a signal r2 of frequency 1.048951049 kHz. The corresponding value of D in the divide-by-D circuit 140 is 32, and the output frequency f3 of the divide-by-D circuit 140 is 384 kHz. The corresponding value of N in the divide-by-N circuit 156 is 50, while the frequency of the VCO 155 is 19.2 MHz. The corresponding value of M in the divide-by-M circuit 160 is 18304, while the output frequency of the divide-by-M circuit 160 is 1.048951049 kHz. Other examples are illustrated in FIG. 5.

The present invention thus provides a stable and flexible PLL system that provides a fast response time, while providing compatibility with a variety of video standards.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A phase locked loop system, comprising:
    a first phase frequency detector for detecting a difference between an internal clock signal and an external clock signal, said first phase frequency detector generating a first control signal representing the difference;
    a first voltage controlled oscillator coupled to said first phase frequency detector, for generating a first timing signal based on said first control signal;
    a first divider circuit coupled to said first voltage controlled oscillator, for dividing said first timing signal by a first predetermined number to provide an output signal;
    a second phase frequency detector for detecting a difference between the first timing signal and a second timing signal, said second phase frequency detector generating a second control signal representing the difference;
    a second voltage controlled oscillator coupled to said second phase frequency detector, for generating a third timing signal based on said second control signal;
    a second divider circuit coupled to said second voltage controlled oscillator, for dividing said third timing signal by a second predetermined number to provide the second timing signal;
    a third divider circuit coupled to said second voltage controlled oscillator, for dividing said third timing signal by a third predetermined number to provide said internal clock signal.

2. The system of claim 1, wherein said first voltage controlled oscillator is a voltage controlled crystal oscillator.

3. The system of claim 1, wherein the first phase frequency detector detects a frequency difference between the internal clock signal and the external clock signal during a first state, said first phase frequency detector generating the first control signal representing the frequency difference.

4. The system of claim 3, wherein the first phase frequency detector detects a phase difference between the internal clock signal and the external clock signal during a second state, said first phase frequency detector generating the first control signal representing the phase difference.

5. The system of claim 4, wherein the first state is an unlocked state and the second state is a locked state.

6. The system of claim 1, wherein the second phase frequency detector for detecting a frequency difference between the first timing signal and a second timing signal during a first state, said second phase frequency detector generating a second control signal representing the frequency difference.

7. The system of claim 6, wherein the second phase frequency detector for detecting a phase difference between the first timing signal and a second timing signal during a second state, said second phase frequency detector generating a second control signal representing the phase difference.

8. The system of claim 7, wherein the first state is an unlocked state and the second state is a locked state.

9. The system of claim 1, further comprising a fourth divider circuit having an output coupled to an input of said first phase detector, said fourth divider circuit being coupled to receive said external clock signal, said fourth divider circuit dividing said external clock signal by a fourth predetermined number.

10. The system of claim 9, further comprising a fifth divider circuit having an input coupled to an output of said first voltage controlled oscillator, said fifth divider having an output coupled to an input of said second phase detector, said fifth divider dividing said first timing circuit by a fifth predetermined number.

11. The system of claim 1, wherein said first predetermined number is a ratio of a frequency of said external clock signal to a frequency of said output signal.

12. The system of claim 1, wherein said second predetermined number is a value of a frequency of said external clock signal multiplied by said third predetermined number, divided by a frequency of said first voltage controlled oscillator.

13. The system of claim 10, wherein said fifth predetermined number is a ratio of a first value to a second value, where said first value is a frequency of the first voltage controlled oscillator multiplied by said second predetermined number, and said second value is a frequency of the external clock signal multiplied by said third predetermined number.

14. The system of claim 1, wherein said external clock signal is a timing signal for providing video information.

15. The system of claim 1, wherein said second timing signal is a timing signal for providing audio information.

16. The system of claim 1, further comprising a loop filter coupled between said first phase frequency detector and said first voltage controlled oscillator.

17. The system of claim 1, further comprising a reset line coupled to said first, said second and said third divider circuits, said reset line being coupled to receive a reset signal for resetting said first, said second and said third divider circuits.

18. The system of claim 17, where reset signal is applied synchronously with respect to a frame edge of said external clock signal.

19. A method for synchronizing an external clock signal to a timing signal, comprising:

detecting a difference between an internal clock signal and an external clock signal and generating a first control signal representing the difference;

generating a first timing signal based on said first control signal;

dividing said first timing signal by a first predetermined number to provide an output signal;

detecting a difference between the first timing signal and a second timing signal and generating a second control signal representing the difference;

generating a third timing signal based on said second control signal;

dividing said third timing signal by a second predetermined number to provide the second timing signal;

dividing the third timing signal by a third predetermined number to provide said internal clock signal.

20. The method of claim 19, wherein in detecting a difference between an internal clock signal and an external clock signal, the difference is one of: a phase and a frequency difference.

21. The method of claim 19, wherein in detecting a difference between an internal clock signal and an external clock signal, the difference is one of: a phase and a frequency difference.

22. The method of claim 19, further comprising dividing said external clock signal by a fourth predetermined number.

23. The method of claim 22, further comprising dividing said first timing circuit by a fifth predetermined number.

24. The method of claim 19, wherein in dividing said first timing signal, said first predetermined number is a ratio of a frequency of said external clock signal to a frequency of said output signal.

25. The method of claim 19, wherein in dividing said third timing signal, said second predetermined number is a value of a frequency of said external clock signal multiplied by said third predetermined number, divided by a frequency of said first voltage controlled oscillator.

26. The method of claim 23, wherein in dividing said first timing circuit by a fifth predetermined number, said fifth predetermined number is a ratio of a first value to a second value, where said first value is a frequency of the first voltage controlled oscillator multiplied by said second predetermined number, and said second value is a frequency of the external clock signal multiplied by said third predetermined number.

27. The method of claim 19, wherein in detecting a difference between an internal clock signal and an external clock signal, said external clock signal is a timing signal for providing video information.

28. The method of claim 19, wherein in detecting a difference between the first timing signal and a second timing signal, said second timing signal is a timing signal for providing audio information.

29. The method of claim 19, further comprising filtering said first control signal.

30. The method of claim 19, further comprising determining a lowest value for each of said first, second and third predetermined numbers.

31. The method of claim 19, wherein in dividing said first timing signal, dividing said second timing signal and dividing said third timing signal are respectively performed by a first, a second and a third divider circuit, said method further comprising resetting said first, said second and said third divider circuits synchronously.

32. The method of claim 31, further comprising synchronizing resetting with respect to a frame edge of said external clock signal.

* * * * *